(12) United States Patent
Sewell

(10) Patent No.: US 7,736,825 B2
(45) Date of Patent: Jun. 15, 2010

(54) LITHOGRAPHIC APPARATUS AND DEVICE MANUFACTURING METHOD UTILIZING A RESETTABLE OR REVERSIBLE CONTRAST ENHANCING LAYER IN A MULTIPLE EXPOSURE SYSTEM

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 871 days.

(21) Appl. No.: 11/439,290

(22) Filed: May 24, 2006

(65) Prior Publication Data

US 2006/0286482 A1    Dec. 21, 2006

Related U.S. Application Data

(60) Provisional application No. 60/686,415, filed on Jun. 2, 2005.

(51) Int. Cl.
*G03F 7/00* (2006.01)
*G03F 7/20* (2006.01)

(52) U.S. Cl. .............. 430/19; 430/270.15; 430/273.1; 430/394; 430/396; 430/320; 430/321; 430/945

(58) Field of Classification Search .............. 430/19, 430/394, 396, 273.1, 320, 321, 945, 270.15
See application file for complete search history.

(56) References Cited

U.S. PATENT DOCUMENTS

| 4,904,569 A | 2/1990 | Fukuda et al. |
|---|---|---|
| 4,942,113 A * | 7/1990 | Trundle .................. 430/326 |
| 5,414,385 A | 5/1995 | Worsham, Jr. |
| 5,563,012 A | 10/1996 | Neisser |
| 6,042,998 A | 3/2000 | Brueck et al. |
| 6,611,316 B2 | 8/2003 | Sewell |
| 7,510,818 B2 * | 3/2009 | Chen et al. .................. 430/320 |

(Continued)

FOREIGN PATENT DOCUMENTS

DE    250 400 A1    10/1987

(Continued)

OTHER PUBLICATIONS

Neisser, M., "Simulation and Experimental Evaluation of Double Exposure Techniques," SPIE-The International Society for Optical Engineering, Feb. 25-27, 1998, vol. 3334, pp. 372-383.

(Continued)

*Primary Examiner*—Amanda C. Walke
(74) *Attorney, Agent, or Firm*—Sterne, Kessler, Goldstein & Fox P.L.L.C.

(57) ABSTRACT

A device manufacturing system and method are used to perform multiple exposures utilizing a resettable or reversible contrast enhancing layer. A radiation sensitive layer is formed on a substrate. A resettable or reversible contrast enhancing layer is formed on the radiation sensitive layer. The resettable or reversible contrast enhancing layer is bleached with a first pattern. The first pattern formed in the resettable or reversible contrast enhancing layer is transferred to the radiation sensitive layer. The resettable or reversible contrast enhancing layer is reset to unbleach the resettable or reversible contrast enhancing layer. The resettable or reversible contrast enhancing layer is bleached with a second pattern. The second pattern formed in the resettable or reversible contrast enhancing layer is transferred to the radiation sensitive layer.

15 Claims, 17 Drawing Sheets

U.S. PATENT DOCUMENTS

| | | | |
|---|---|---|---|
| 2002/0182549 | A1 | 12/2002 | Chang et al. |
| 2003/0039893 | A1 | 2/2003 | Farnsworth et al. |
| 2007/0154850 | A1* | 7/2007 | Menon .................. 430/322 |
| 2008/0003525 | A1 | 1/2008 | Amaya |
| 2008/0182178 | A1* | 7/2008 | Hoffnagle et al. ............ 430/4 |

FOREIGN PATENT DOCUMENTS

| | | |
|---|---|---|
| JP | 7-120922 A | 5/1995 |
| JP | 10-050591 A | 2/1998 |
| WO | WO 2006/046475 A1 | 5/2006 |

OTHER PUBLICATIONS

Ebihara, T. et al., "Beyond $k_1$=0.25 Lithography: 70nm L/S Patterning Using KrF Scanners" SPIE-The International Society for Optical Engineering, Sep. 9-12, 2003, vol. 5256, pp. 985-994.

Ooki, H. et al., "Experimental Study on Non-Linear Multiple Exposure Method," SPIE-The International Society for Optical Engineering, 1997, vol. 3051, pp. 85-93.

Jacobs, H., U.S. Appl. No. 11/123,232, filed May 6, 2005, entitled "Lithographic Apparatus and Device Manufacturing Method Utilizing a Flat Panel Display Handler".

English translation of DD250400A1, Pforr et al., filed Oct. 8, 1987, 14 pages.

Notification of Reasons for Refusal mailed Aug. 25, 2009 for Japanese Patent Application No. 2006-152942, 4 pgs.

* cited by examiner

LITHOGRAPHIC APPARATUS AND DEVICE MANUFACTURING METHOD UTILIZING A RESETTABLE OR REVERSIBLE CONTRAST ENHANCING LAYER IN A MULTIPLE EXPOSURE SYSTEM

CROSS REFERENCE TO RELATED APPLICATIONS

This application claims priority under 35 U.S.C. §119(e) to U.S. Provisional Application No. 60/686,415, filed Jun. 2, 2005, which is incorporated by reference herein in its entirety.

BACKGROUND

1. Field of the Invention

The present invention relates to lithography systems and device manufacturing methods.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

A double exposure technique can be used to improve resolution of optical exposure systems by exposing lower resolution patterns interstitially using first and second images, which can effectively double the resolution capability of an optical system. Extremely high resolution patterns are deconvolved into two lower resolution patterns (e.g., the first and second images), which can be exposed interstitially on the substrate.

One way to perform double exposure is to expose the first image, remove the wafer from the exposure tool, develop and process the wafer, recoat the wafer with a resist, reload the wafer in the exposure tool, and expose the wafer with the second image.

Another way to perform double exposure is to use a contrast enhancing layer on top of the resist layer. This contrast enhancing layer increases resolution of patterned images and prevents the first image from exposing resist in the area where the second image will be placed. The contrast enhancing layer is removed between exposures and reformed. Two passes through the exposure system are performed, along with substrate alignment between passes. Thus, removing and reapplying the contrast enhancing layer can dramatically decrease throughput, and may cause misalignment between patterns formed by the first and second images.

Therefore, what is needed is a system and method that provide a contrast enhancing layer that does not need to be removed and reapplied between exposures in a multi-exposure process.

SUMMARY

In one embodiment of the present invention, there is provided a device manufacturing method utilizing a resettable or reversible contrast enhancing layer comprising the steps described below. A radiation sensitive layer is formed on a substrate. The resettable or reversible contrast enhancing layer is formed on the radiation sensitive layer. The resettable or reversible contrast enhancing layer is bleached with a first pattern. The first pattern formed in the resettable or reversible contrast enhancing layer is allowed to transmit to the radiation sensitive layer. The resettable contrast enhancing layer is reset or the reversible contrast enhancing layer is reversed to unbleach the resettable or reversible contrast enhancing layer. The resettable or reversible contrast enhancing layer is bleached with a second pattern. The second pattern formed in the resettable or reversible contrast enhancing layer is allowed to transmit to the radiation sensitive layer.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 5:
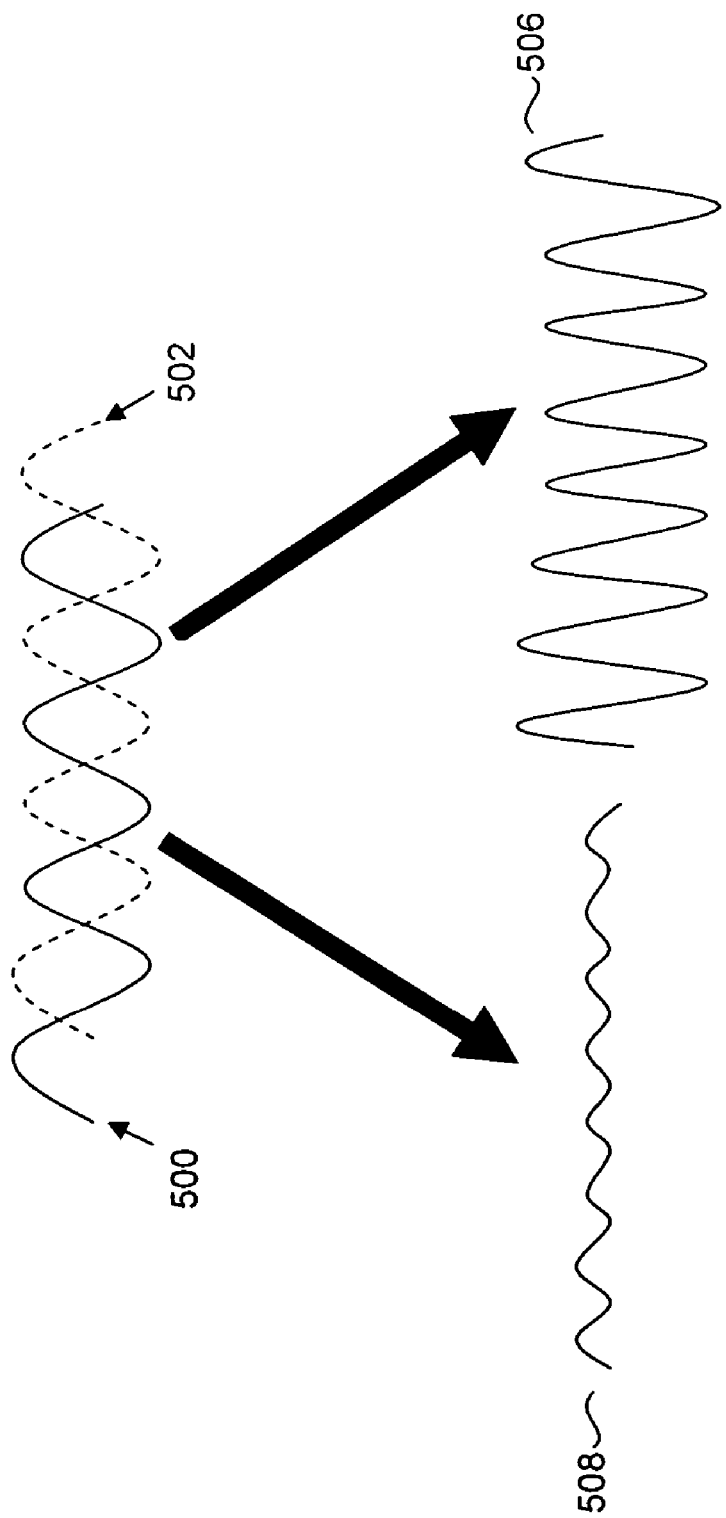
FIG. 5 shows first and second images that form a double image in a double exposure process.
Figure 6:
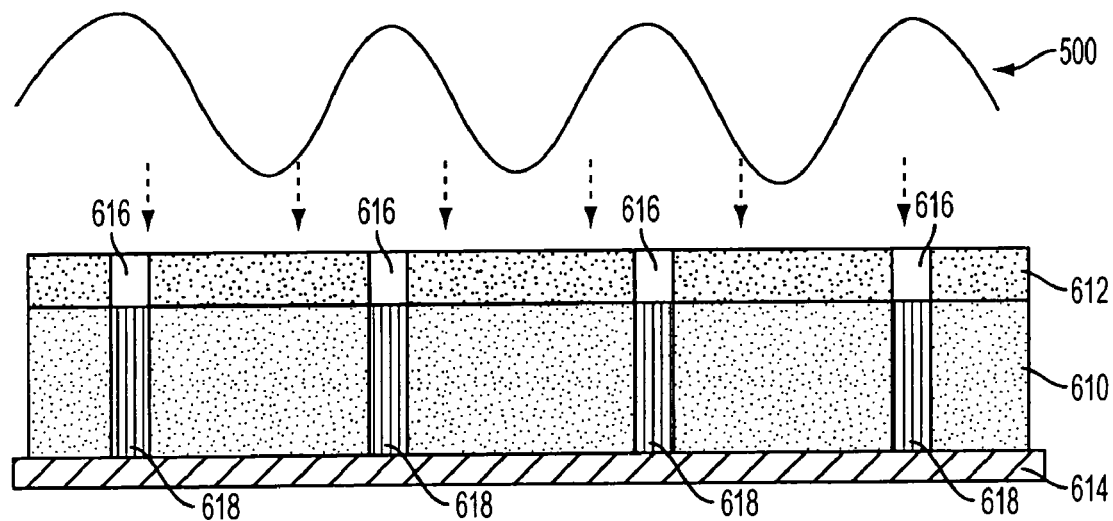
Figure 7:
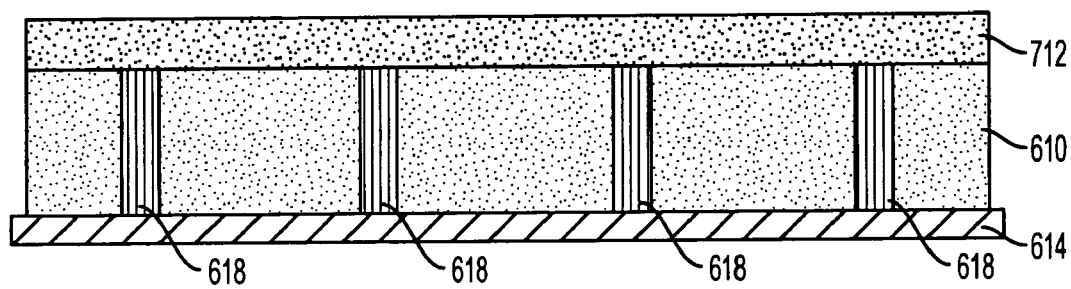
Figure 8:
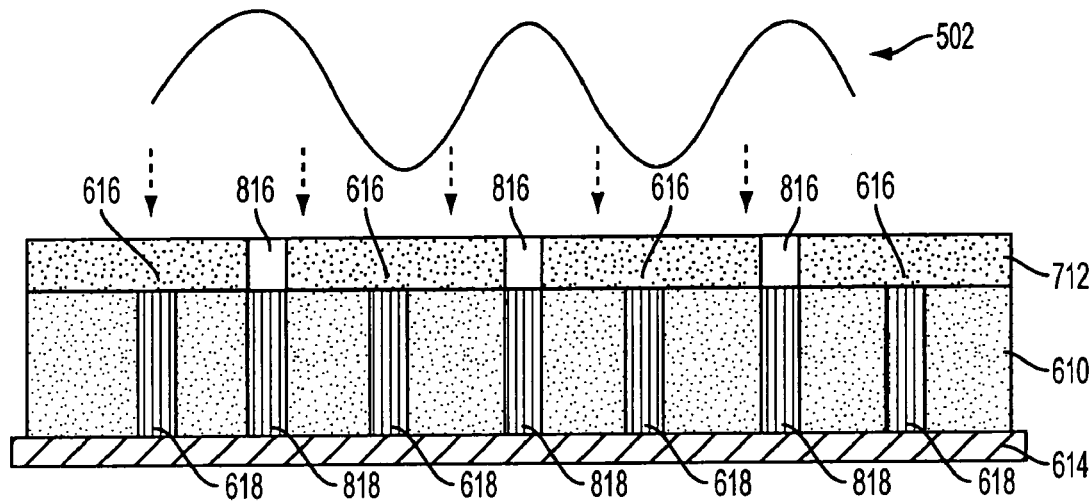

FIGS. 6, 7, and 8 schematically show a double exposure process using a contrast enhancing layer and the first and second images in FIG. 5.

Figure 9:
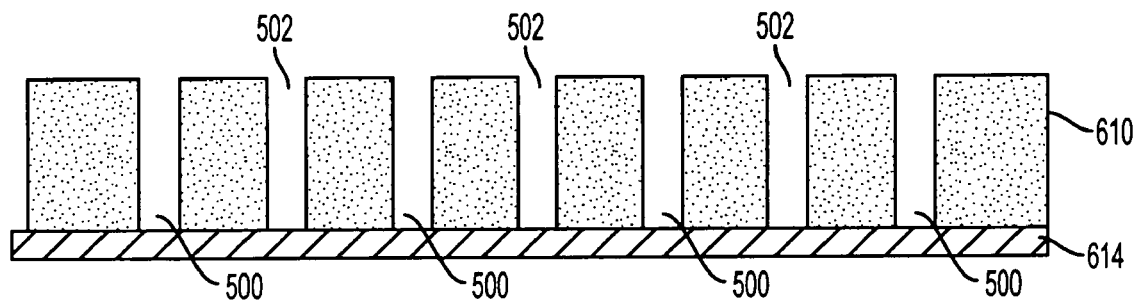

FIG. 9 shows a final pattern formed in a resist after the double exposure process in FIGS. 6, 7, and 8 from the first and second images in FIG. 5 after a second contrast enhancing layer is removed.

Figure 10:
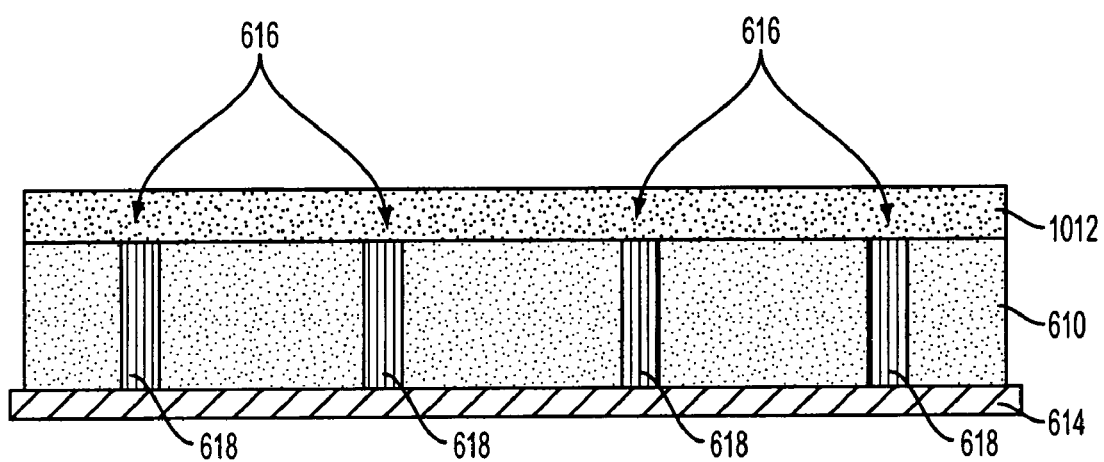
Figure 11:
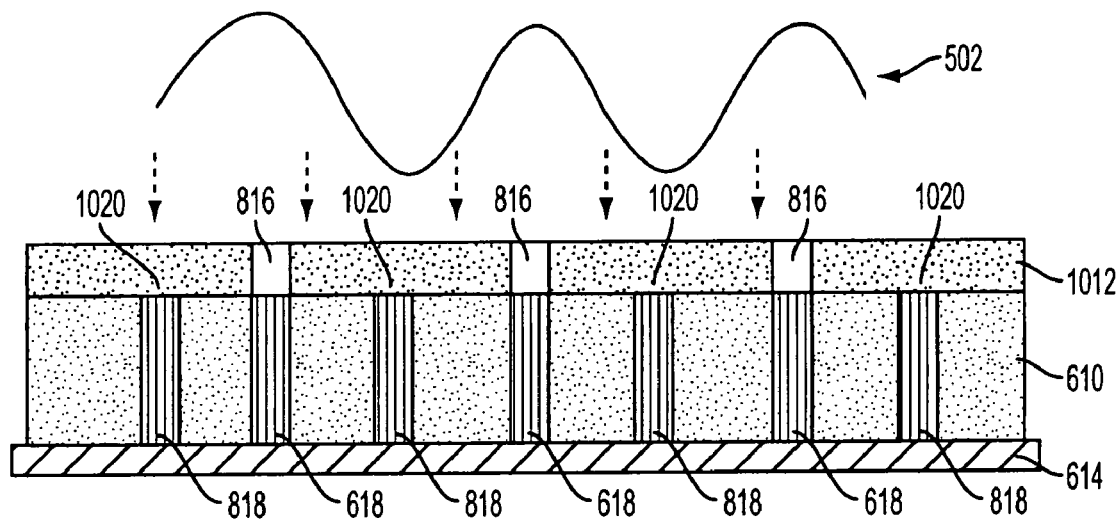

FIGS. 10 and 11 schematically show a multiple exposure process using the first and second images in FIG. 5 and using a resettable or reversible contrast enhancing layer, according to one embodiment of the present invention.

Figure 12:
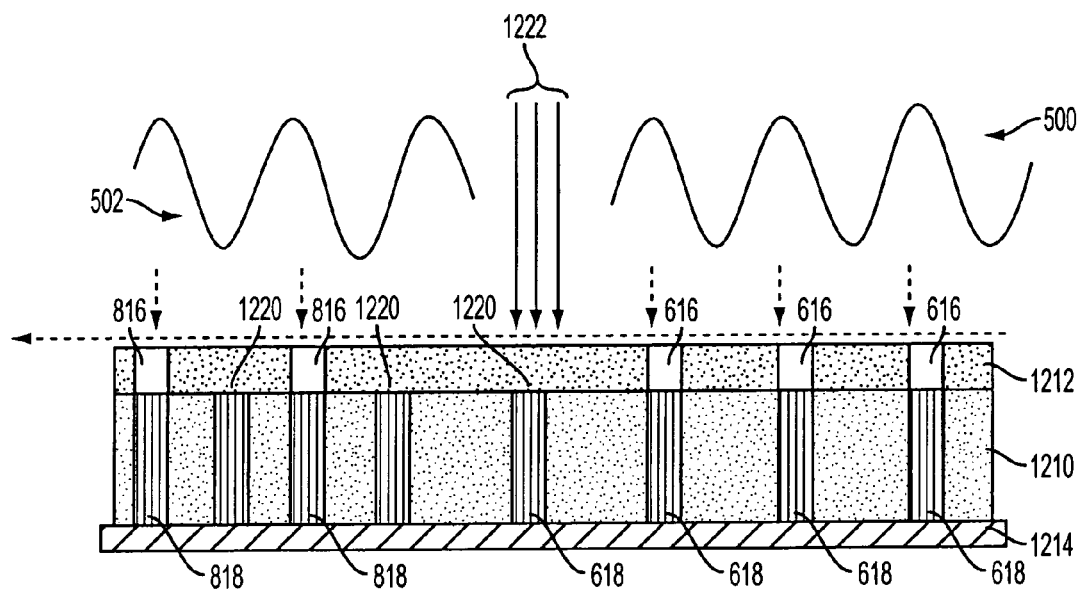

FIG. 12 schematically shows a multiple exposure process using an actively resettable contrast enhancing layer, according to one embodiment of the present invention.

Figure 13:
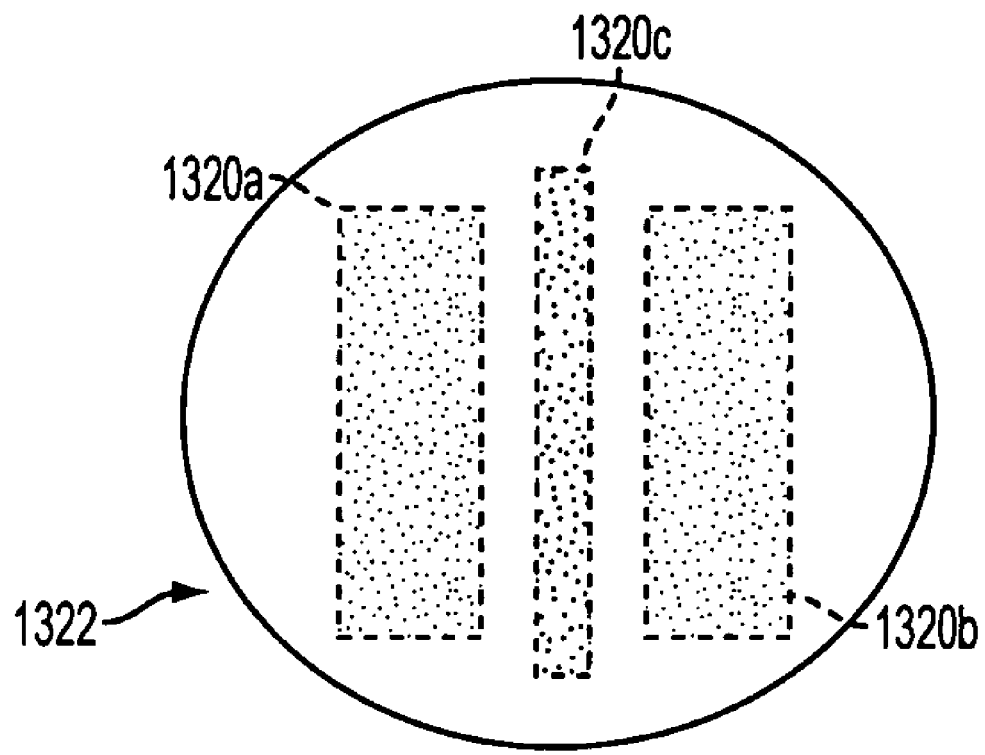

FIG. 13 shows an exit pupil of a projection system having three channels that can be used to perform the multiple exposure process in FIG. 12, according to one embodiment of the present invention.

Figure 14:
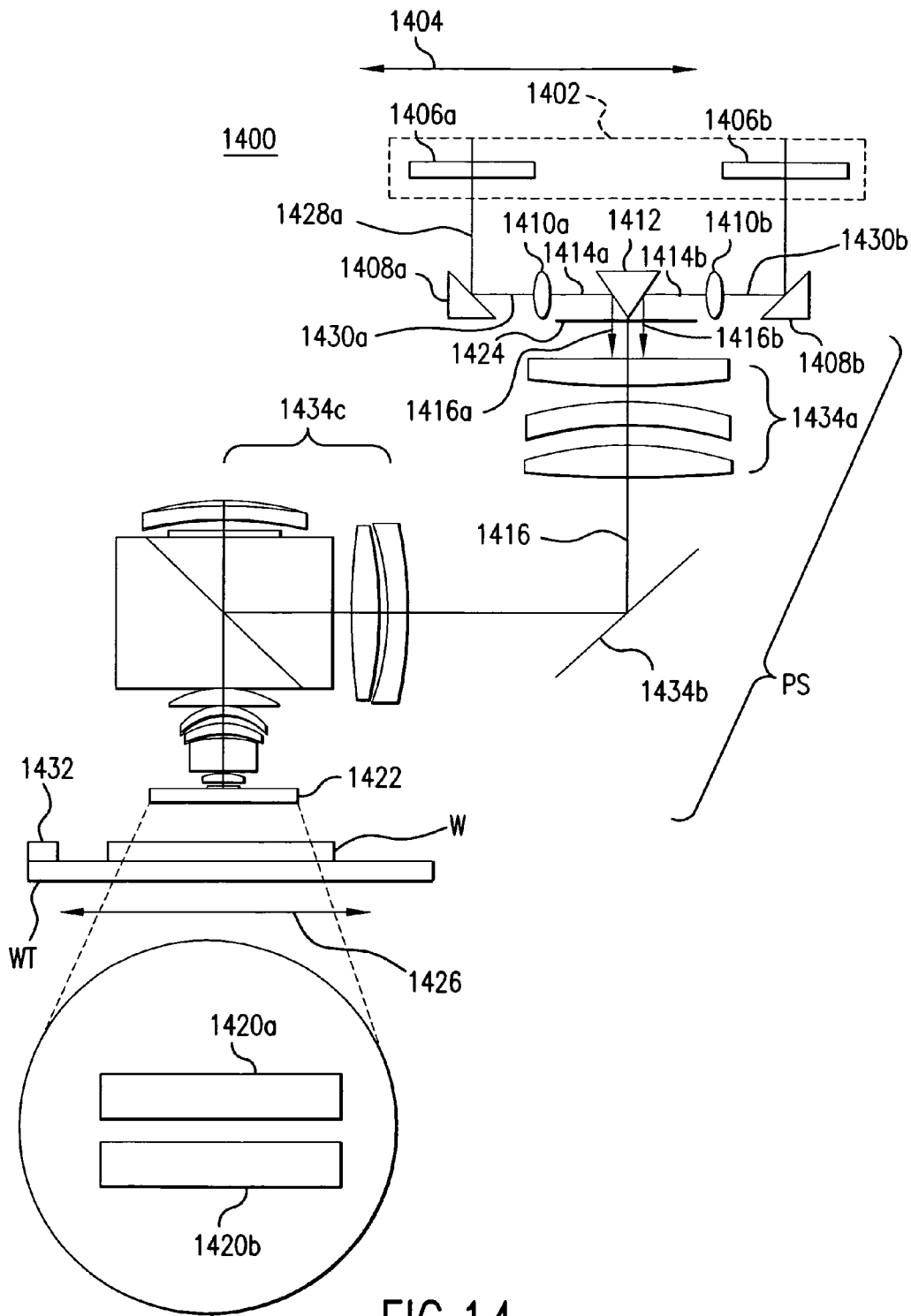

FIG. 14 shows a dual-stage, dual-exposure mask-based lithography system, according to one embodiment of the present invention.

Figure 15:
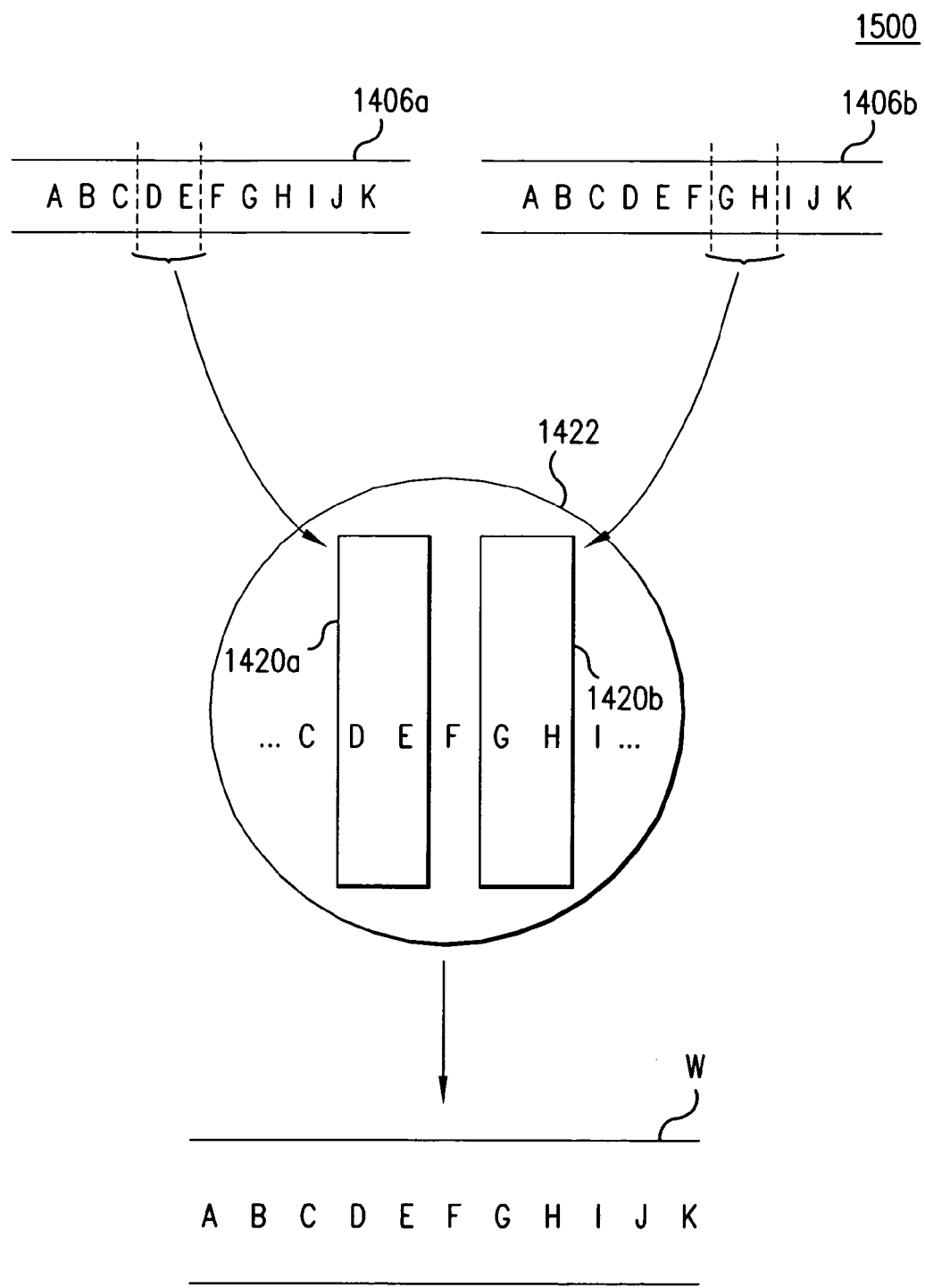

FIG. 15 shows an exit pupil of a projection system having two channels, according to one embodiment of the present invention.

Figure 16:
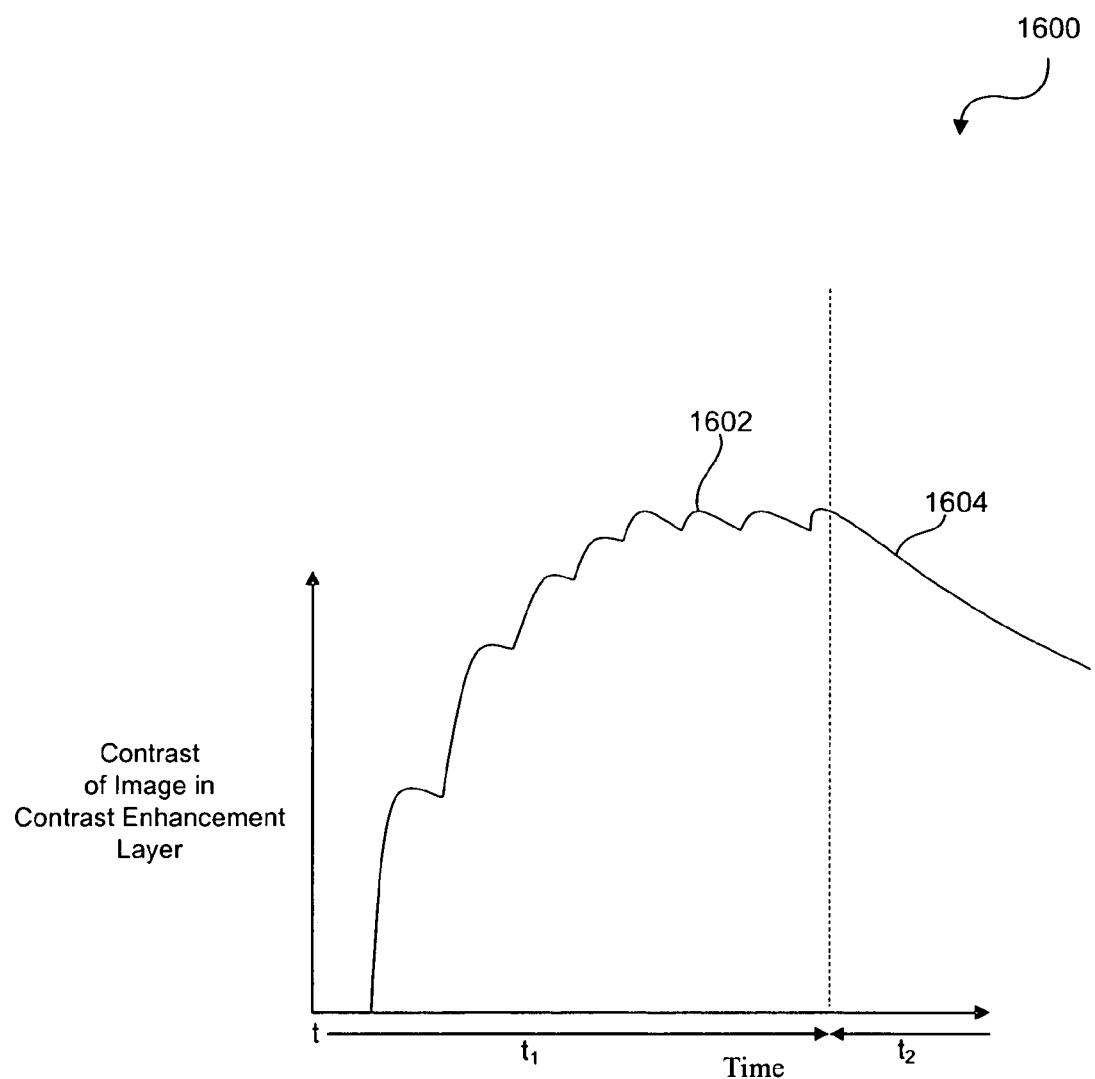

FIG. 16 shows a fading curve or a contrast change curve for a passively reversible contrast enhancing layer, according to one embodiment of the present invention.

Figure 17:
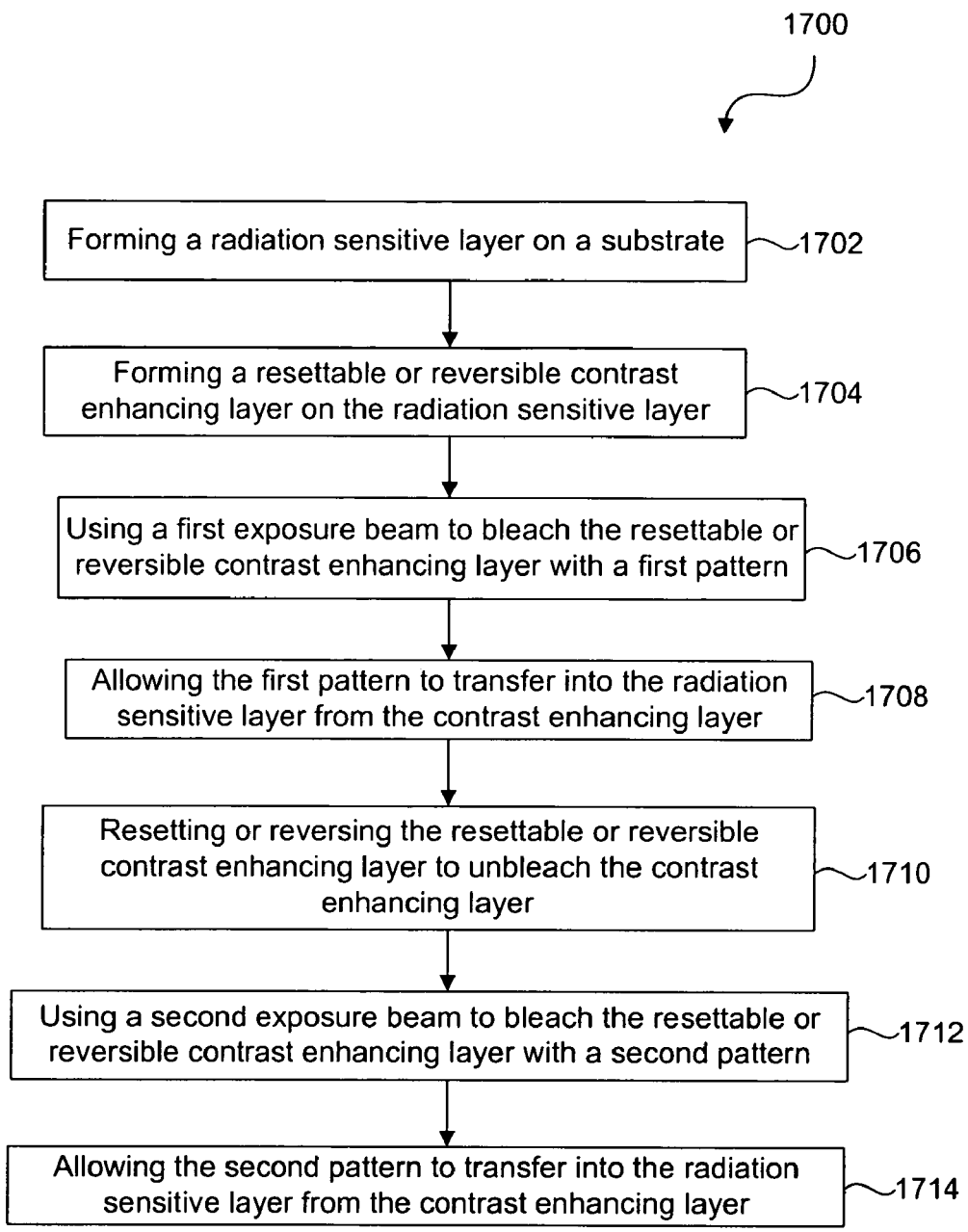

FIG. 17 shows a flowchart depicting a multiple exposure method, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
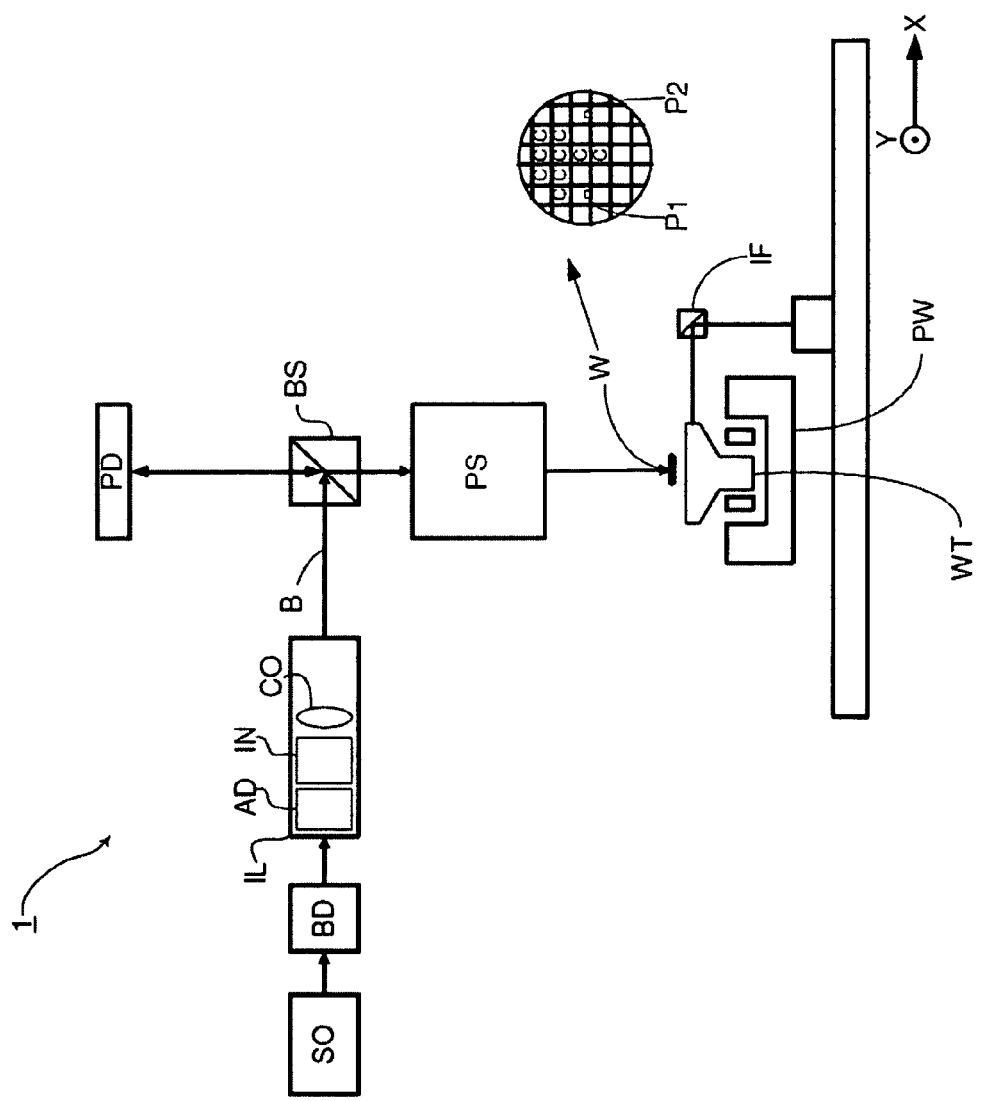
FIGS. 1 and 2 depict lithographic apparatus, according to various embodiments of the present invention.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. The thickness of the substrate may be at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
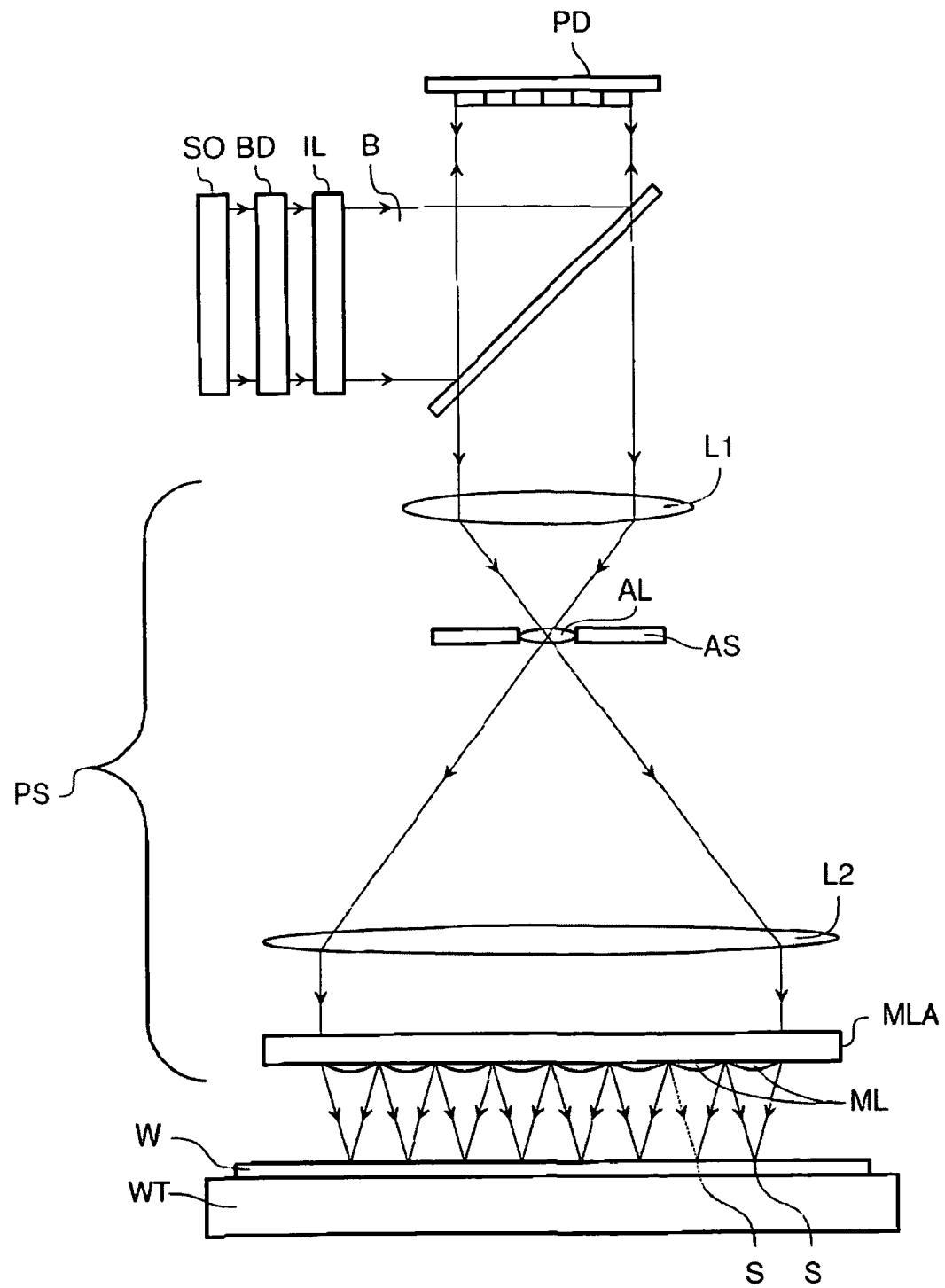

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 run, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

FIG. 14 shows a multiple exposure mask-based lithography system 1400, according to one embodiment of the present invention. System 1400 includes a scanning stage 1402 capable of scanning along range 1404. Scanning stage 1402 can be used to support dual reticles 1406*a* and 1406*b*. System 1400 also includes first and second optical components 1408*a* and 1408*b*, first and second optical elements 1410*a* and 1410*b*, and a prism 1412.

In one example, optical components 1408*a* and 1408*b* can provide focusing, alignment, and offset adjustment. For example, optical components 1408*a* and 1408*b* can be fold mirrors.

In one example, first and second optical elements 1410*a* and 1410*b* can optically couple respective optical components 1408*a* and 1408*b* to prism 1412. Alternatively, or additionally, optical elements 1410*a* and 1410*b* can be optical relays or pupil filters. According to the latter example, pupil filters 1410*a* and 1410*b* can be contractile apertures for conditioning beams 1430*a* and 1430*b*. For example, pupil filters 1410*a* and 1410*b* can alter the focus and/or intensity of beams 1430*a* and 1430*b*. The pupil filters 1410*a* and 1410*b* can also be used to independently condition each channel of beams 1430*a* and 1430*b*. Additionally, or alternatively, both pupil filters and optical relays can be used within optical element 1410*a* and 1410*b*.

In one example, prism 1412 can be a mirror shaped to align incident beams 1414*a* and 1414*b* with a projection system PS, as indicated by beams 1416*a* and 1416*b*. Additionally, or alternatively, prism 1412 can be a beam-splitter or a beam-combiner. Additionally, or alternatively, prism 1412 can have phase-shifting properties in at least one side and/or surface.

The reticles 1406*a* and 1406*b* are each exposed by a source of illumination (not shown, but see FIGS. 1 and 2). The illumination transmits through reticles 1406*a* and 1406*b* providing images or beams 1428*a* and 1428*b*, respectively. The dual reticle images 1428*a* and 1428*b* are incident upon respective optical elements 1408, 1410, and 1412. Beam 1428*a* travels from reticle 1406*a* to optical component 1408*a*. At optical component 1408*a*, beam 1428*a* is directed as image or beam 1430*a* to optical element 1410*a*. Optical element 1410*a* passes beam 1430*a* as image or beam 1414*a* to prism 1412. A similar beam path is followed for images or beams 1428*b*, 1430*b*, and 1414*b*.

In one example, substrate W on substrate stage WT is passed through an exposure sequence once with images from reticles 1406*a* and 1406*b* being exposed simultaneously onto substrate W. The throughput of system 1400 is effectively maintained at a standard single pass throughput level, which results in a throughput of twice that of conventional systems.

Alternatively, or additionally, system 1400 produces two images 1420*a* and 1420*b* side-by-side in an exit pupil 1422 (e.g., an image field) of projection system PS. An exit pupil 1422 of the system 1400 allows for the passage of energy to a substrate stage WT, which, as discussed above, is capable of supporting one or more substrates W and is capable of scanning along range of motion 1426. The scanning action of lithography system 1400 effectively superimposes the two images 1420a and 1420b during the exposure of substrate W. Each image 1420a and 1420b exposes a radiation sensitive layer (not shown) of substrate W as it is scanned through the image field (i.e., the surface area of the substrate W being scanned) synchronously with the scanning of reticles 1406a and 1406b. Additionally, or alternatively, the image scanning is synchronized so that the two images 1420a and 1420b are superimposed.

Alternatively, the two images 1420a and 1420b can be independently focused and aligned. Additionally, or alternatively, the illumination conditions of the two images 1420a and 1420b can be independently set and controlled. For example, the components 1406a, 1408a, and 1410a can be aligned and focused, as well as controlled (i.e., scanned) independently of components 1406b, 1408b, and 1410b, such that the resulting images can be determined with greater precision.

In one example, an intermediate image plane 1424 is defined between prism 1412 and projection system PS. Additionally, or alternatively, there are other positions for the intermediate image plane 1424 that exist between optical elements 1410 and prism 1412 and/or on both sides of optical elements 1410 and/or prism 1412. The intermediate image plane 1424 provides a reference for alignment, focusing, and offset calculations of lithography system 1400.

Additionally, or alternatively, projection system PS can include a first optical block 1434a, a second optical block 1434b, and a third optical block 1434c. In one example, first optical block 1434a provides beam conditioning and initial image reduction to beam 1416, and directs beam 1416 onto mirror 1434b. Mirror 1434b directs beam 1416 onto optical block 1434c. Optical block 1434c provides the final reduction of beam 1416, and directs beam 1416 through exit pupil 1422.

In an alternative example, the at least two images 1420a and 1420b are produced from at least two separate patterns on a same one of the reticles, e.g., either 1406a or 1406b.

Additionally, or alternatively, fine alignment and positioning of images of beams 1428a and 1428b are accomplished using a detector 1432 on the substrate stage WT. In one example, the alignment of the images can be monitored using alignment marks on the dual reticles 1406a and 1406b.

Additionally, or alternatively, detector 1432 can be used on the substrate stage WT to receive images 1428a and 1428b from the scanning stage 1402. Detector 1432 can allow for real-time system calibration between the stages 1402 and WT.

In one example, the exposure dose delivered to each reticle image can be independently controlled by adjusting the illumination intensity in each illumination slit. In another example, the images from of at least a portion of each of the dual reticles 1406a and 1406b are images from different locations of one of the dual reticles 1406a and 1406b.

FIG. 15 shows an exit pupil 1422 of projection system PS having two channels (e.g., producing two images 1420a and 1420b), according to one embodiment of the present invention. Reticle 1406a and reticle 1406b have patterns, such as "ABCDEFGHIJK." This pattern is for illustrative purposes. These patterns are visible at exit pupil 1422, which indicates the superimposition of the patterns on the substrate W. Reticles 1406a and 1406b are imaged at exit pupil 1422 and the images 1420a and 1420b are exposed onto substrate W.

An exemplary system and method for doing this is described in U.S. Pa. No. 6,611,316, which is incorporated by reference herein in its entirety.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
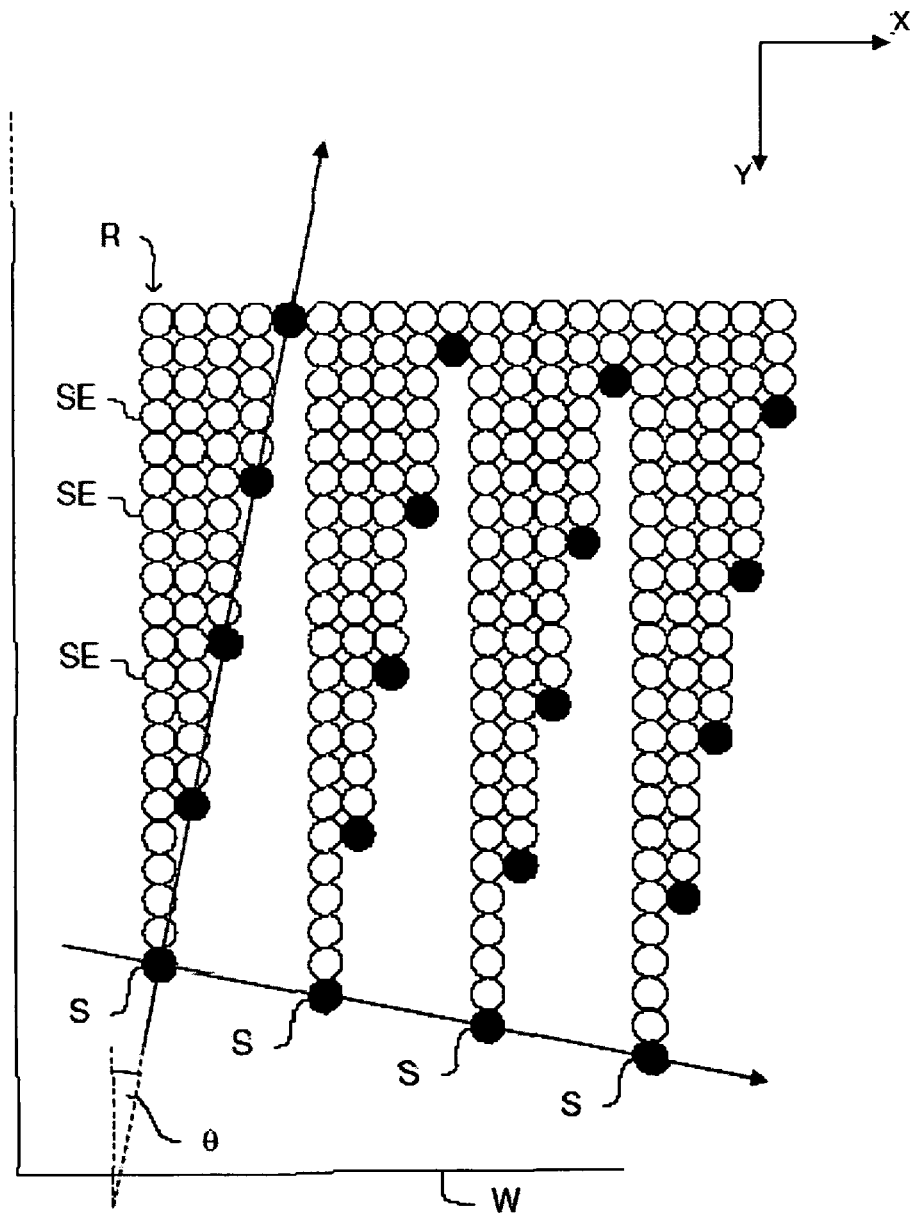
FIG. 3 depicts a mode of transferring a pattern to a substrate, according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
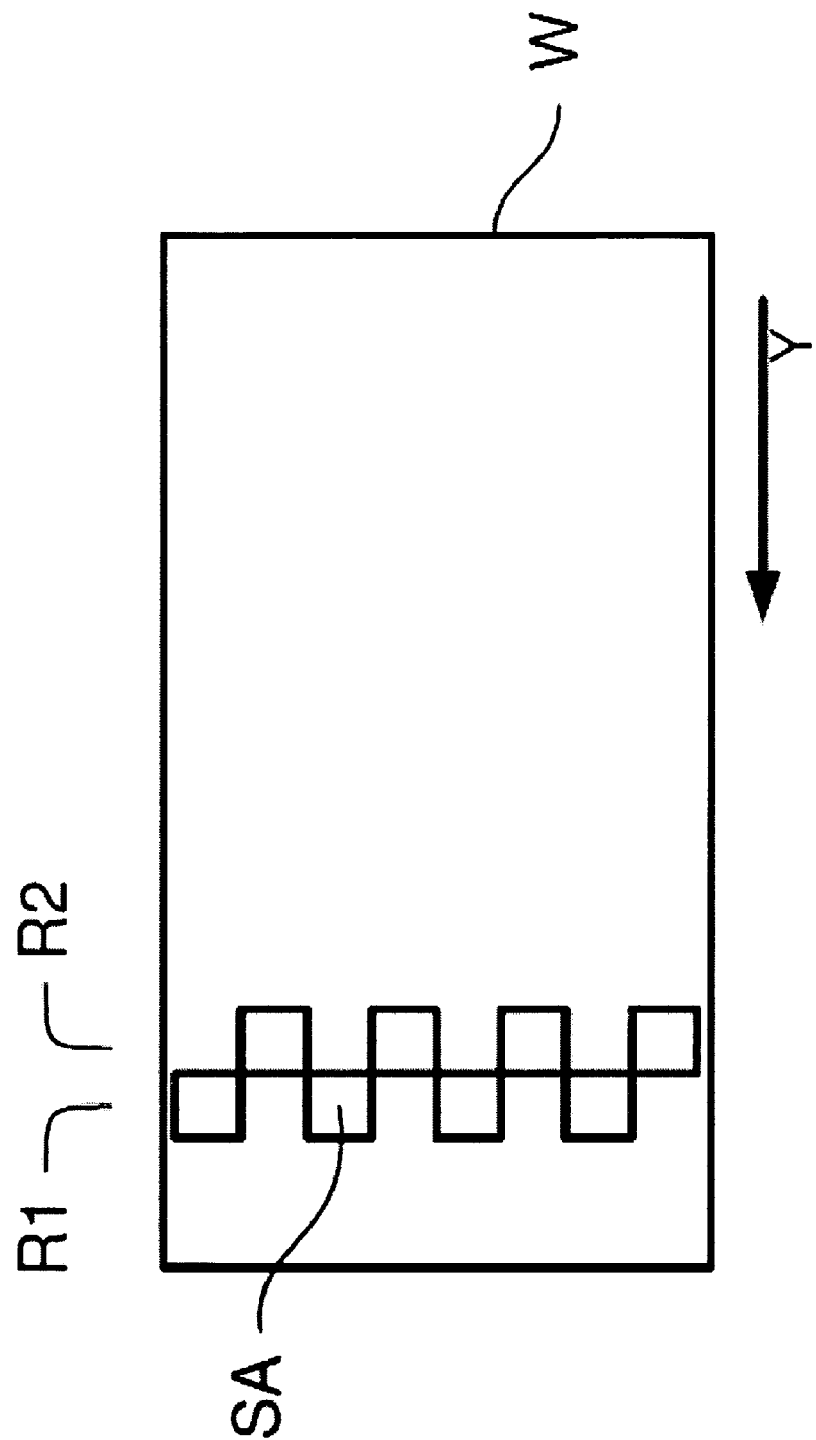
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1,R2 in a 'chess board' configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Double Exposure Using a Contrast Enhancing Layer

In one embodiment of the present invention, there is provided a device manufacturing method utilizing a resettable or reversible contrast enhancing layer comprising the steps described below. A radiation sensitive layer is formed on a substrate. A resettable or reversible contrast enhancing layer is formed on the radiation sensitive layer. The resettable or reversible contrast enhancing layer is bleached with a first pattern by exposure to a corresponding first pattern image. Bleached features of the first pattern formed in the resettable or reversible contrast enhancing layer have a transmittance for exposure radiation different from the transmittance of unbleached areas. The radiation sensitive layer is allowed to be exposed to a first pattern of radiation by transmittance of exposure radiation through the resettable or reversible contrast enhancing layer patterned with bleached features of the first pattern. The resettable contrast enhancing layer is reset or the reversible contrast enhancing layer is reversed to unbleach the resettable or reversible contrast enhancing layer. The resettable or reversible contrast enhancing layer is bleached with a second pattern. Bleached features of the second pattern formed in the resettable or reversible contrast enhancing layer allow exposure of the radiation sensitive layer to a second pattern of radiation by transmittance of exposure radiation through the resettable or reversible contrast enhancing layer patterned with the bleached features of the second pattern.

FIG. 5 shows first and second images 500 and 502 that can be combined using a double exposure process. For example, this can be accomplished using the system of FIG. 14. A waveform 506 corresponds to a first image, is formed using the double exposure process when a contrast enhancing layer is formed on a resist of a wafer, as described in more detail below. Another waveform 508 corresponds to a lower resolution image that is formed using the double exposure technique when no contrast enhancing layer is formed. As can be seen, using the contrast enhancing layer can result in an image having a substantially higher resolution.

FIGS. 6, 7, and 8 schematically show a double exposure process using first and second contrast enhancing layers 612/712, and the first and second images 500 and 502, alternatively referred to as waveforms, from FIG. 5. FIGS. 6, 7, and 8 show a substrate 614 including a radiation sensitive layer 610 (e.g., a resist, hereinafter radiation sensitive layer and resist are each referred to as resist) formed thereon. FIG. 6 shows first contrast enhancing layer 612 formed on resist 610, while FIGS. 7 and 8 show a second contrast enhancing layer 712 formed on resist 610. Second contrast enhancing layer 712 is formed on resist 610 after a first image 500 is patterned in resist 610 and after removing first contrast enhancing layer 612.

It is to be appreciated that a number of areas formed in resist 610 from first and second images 500 and 501 can be more or less than the various examples disclosed herein without departing from the scope of the present invention.

FIG. 6 shows first image 500 being exposed into first contrast enhancing layer 612 and into resist 610. Exposure of first image 500 into first contrast enhancing layer 612 causes areas that receive first image 500 to become bleached areas 616.

Bleached areas 616 "allow" patterns 618 to be formed in resist 610. What can be meant by "allow" is that patterns 618 are formed in/transmitted to resist 610 through an extended dosing/exposure of first contrast enhancing layer 612 with first pattern 500, which dose/exposure continues until patterns 618 are transmitted through first contrast enhancing layer 612 into resist 610. In one example, bleached areas 616 can be areas where first image 500 is recorded in first contrast enhancing layer 612, which changes a transmittance characteristic or opaqueness, e.g., reduces or increases transmissivity, in bleached areas 616 of first contrast enhancing layer 612.

It is to be appreciated that "bleaching" and "unbleaching" as applied to a contrast enhancing layer are processes in which the optical transmission is deliberately changed by an action such as irradiation with photons or a bake process. "Bleaching" means to make more transparent, while "unbleaching" means to make more opaque. "Fading" is a change in optical transmission, unbleaching by a natural relaxation of the transmission properties of the material. These terms are applied to a contrast enhancing layer where the image bleaches the photo dye in the material to increase the transparency of the imaged area and hence increases the contrast in the image as observed by the resist layer under the contrast enhancing layer.

As seen in FIG. 7, after first contrast enhancing layer 612 is removed, resist 610 is recoated to form a second contrast enhancing layer 712.

As seen in FIG. 8, second image 502 is exposed into second contrast enhancing layer 712 interstitially between areas 618 of resist 610 where first image 500 was exposed. Second image 502 forms bleached areas 816 in second contrast enhancing layer 712. Thus, bleached areas 816 are formed interstitially with respect to where bleached areas 616 were formed on first contrast enhancing layer 612. Bleached areas 816 are utilized to form interstitial patterns 818 in resist 610, which are interstitial with respect to patterns 618. As discussed above, this can increase the resolution, for example effectively double the resolution, of a final pattern 506 formed on substrate 614 compared to conventional lithographic techniques.

In one example, first contrast enhancing layer 612 is removed and resist 610 is recoated to form second contrast enhancing layer 712. In one example, this is done by removing substrate 614 from an exposure tool (not shown) and performing a number of processing steps before substrate 614 is returned to the exposure tool for the second exposure. In various examples, the processing can at least include one or more of conventional pre-exposure and post-exposure lithographic processing steps. For example, the processing may include, after exposure of resist 610, a post exposure bake or a post exposure bake in combination with a resist development.

FIG. 9 shows a final pattern formed in resist 610 after the double exposure process has completed, as described above in connection with FIGS. 6, 7, and 8. The final pattern is formed in resist 610 from the first and second images 500 and 502 in FIG. 5 after second contrast enhancing layer 712 is removed.

Multiple Exposure Techniques Using a Resettable or Reversible Contrast Enhancing Layer FIGS. 10 and 11 schematically show a multiple exposure process using the first and second images 500 and 502 in FIG. 5 and using a resettable or reversible contrast enhancing layer 1012, according to one embodiment of the present invention.

In a first example, contrast enhancing layer 1012 can be resettable (e.g., actively resettable). The active resetting can mean that bleached areas 616 caused by first exposure beam 500 become unbleached areas 1020 through receipt of energy, e.g., a light beam have a wavelength of a predetermined amount, as discussed below, that resets contrast enhancing layer 1012 after the first exposure. Consequently, because contrast enhancing layer 1012 is reset, there is no requirement to remove and reapply contrast enhancing layer 1012, as was described above for contrast enhancing layers 612 and 712.

In a second example, contrast enhancing layer 1012 can be passively reversible. The passive reversing means that bleached areas 616 caused by the first exposure beam 500 become unbleached areas 1020 due to an intrinsic property of a material used to form contrast enhancing layer 1012. For example, the intrinsic property can allow for fading of bleached areas 616 over time. Through fading, contrast enhancing layer 1012 recovers some of its opacity to form unbleached areas 1020. Consequently, because contrast enhancing layer 1012 is reversed, there is no requirement to remove and reapply contrast enhancing layer 1012, as was described above for contrast enhancing layers 612 and 712, nor must energy be applied as in the case of the resettable embodiment.

In one example, a material used to form actively resettable or passively reversible contrast enhancing layer 1012 can be, but is not limited to, a laser dye, or the like.

FIG. 11 schematically shows a point in the multiple exposure process after the reversing or resetting of contrast enhancement layer 1012 and during receipt of second image 502. Thus, once bleached areas 616 have faded (e.g., contrast enhancement layer 1012 has been actively reset or passively reversed) to form unbleached areas 1020, second image 502 of the double exposure process is received. Then, the process, as described above, is followed to allow second pattern 818 to transmit into resist 610.

In one example, layer 1012 can lose substantially all memory of the light scattered into the area where second image 502 is to be exposed.

FIG. 12 schematically shows a multiple exposure process using an actively resettable contrast enhancing layer 1212, according to one embodiment of the present invention. It is to be appreciated that respective first, second and third beams 500, 502, and 1222 may be exposing during different time periods, e.g., a first time period for first beam 500, a second time period for third beam 1222, and a third time period for second beam 502, although they are shown as if occurring during a single time period, as would be appreciated by a skilled artisan. Also, as can be appreciated, although respective first, second, and third beams 500, 502, and 1222 are shown as exposing specific portions of contrast enhancing layer 1212, they may each be exposing an entire portion of contrast enhancing layer 1212 during different time periods or a same time period if all three beams expose substantially simultaneously.

In this example, bleached areas 616 formed from first image (beam) 500 in contrast enhancing layer 1212 are actively unbleached through the use of a third beam 1222. Thus, third beam 1222 is used to actively reset contrast enhancing layer 1212. Third beam 1222, which can be projected from the projection system PS (not shown) between first and second images (beams) 500 and 502, does not carry an image. An illumination wavelength of third beam 1222 is used that allows for an unbleaching of bleached areas 616 in contrast enhancing layer 1212 to form unbleached areas 1220. For example, the value of the wavelength of third beam 1222 will be different than the value(s) for wavelengths used in first and second images 500 and 502. The "unbleaching illumination" allows the multiple exposure process to operate without removing a substrate 1214 from an exposure tool (not shown) between the two exposures. This can alleviate the requirement of aligning substrate 1214 between the two exposures of images 500 and 502 because image channel 1 is aligned to image channel 2 at a patterning device stage (not shown) and both images are aligned together at substrate 1214 for the single pass through the exposure tool. Additionally, or alternatively, not having to remove substrate 1214 between the two exposures of images 500 and 502 can increase throughput.

FIG. 13 shows an exit pupil 1322 (e.g., image field) of a projection system PS having three channels 1320a, 1320b, and 1320c, which can be used to perform the multiple exposure process in FIG. 12, according to one embodiment of the present invention. Exit pupil 1322 includes a first image (i.e., a first beam or channel) 1320a, a second image (i.e., a second beam or channel) 1320b, and a third beam (i.e., a third channel) 1320b. First and second images 1320a and 1320b can be similar to images 1420a and 1420b discussed above with regards to FIG. 14. However, in this embodiment third beam 1320c can include a wavelength of light having a value that allows for the active unbleaching of resettable contrast enhancing layer 1212 (not shown in FIG. 13, see FIG. 12), as discussed above with respect to FIG. 12.

FIG. 16 shows a fading curve or a contrast change curve 1600 for a passively reversible contrast enhancing layer, e.g., contrast enhancing layer 1012, according to one embodiment of the present invention. Thus, curve 1600 is related to the example in which contrast enhancing layer 1012 is passively reversible. The curve 1600 indicates an exemplary change in contrast 1602 of the contrast enhancing layer during an initial exposure time period t1, followed by a change in contrast 1604 of the contrast enhancing layer during a fading time period t2.

Additionally, or alternatively, a time period for forming unbleached areas, e.g., unbleached areas 1020/1220, from bleached areas, e.g., bleached areas 616, in a resettable or reversible contrast enhancing layer, e.g., contrast enhancement layer 1012 or 1212, can be application specific. For example, a contrast enhancing layer 1012/1212 can have image fading or contrast change times as short as, but not limited to, about 1/500 seconds, about 1/100 sec, about 1/10 sec, or about 10 sec. The image fading or contrast change time allows the second exposure, using second image 502, to be accomplished without removing substrate 614 from an exposure tool (not shown) or a chuck (not shown). This can significantly improve the overlay accuracy of second pattern 818 to first pattern 618 in the double exposure process, as well as increasing throughput.

Additionally, or alternatively, the two reticles 1406 being used (not shown, but see FIG. 14) can be substantially identical. When reticles 1406 are substantially identical, bleached areas, e.g., bleached areas 616, in a contrast enhancing layer, e.g., contrast enhancing layer 1012 or 1212, may not completely fade. However, bleached areas 616 fade enough to allow for forming of bleached areas 816.

Exemplary Operation

FIG. 17 shows a flowchart depicting a multiple exposure method 1700, according to one embodiment of the present invention. For example, the method is used to perform multiple exposures utilizing either an actively resettable or passively reversible contrast enhancing layer to increase resolution of a patterned feature. This can be performed using one or more of the exemplary systems described above.

In step 1702, a radiation sensitive layer is formed on a substrate. In step 1704, a resettable or reversible contrast enhancing layer is formed on the radiation sensitive layer. In step 1706, a first exposure beam is used to bleach the resettable or reversible contrast enhancing layer with a first pattern. In step 1708, the first pattern is allowed to transfer into the radiation sensitive layer from the resettable or reversible contrast enhancing layer. For example, the "allowing" can include continuing an image dose that is received by the contrast enhancing layer, such that while the dose continues to expose light in bleached areas the pattern passes down or is transmitted through the resettable or reversible contrast enhancing layer into a radiation sensitive layer. In step 1710, the resettable or reversible contrast enhancing layer is reset or reversed to unbleach the contrast enhancing layer. In step 1712, a second exposure beam is used to bleach the resettable or reversible contrast enhancing layer with a second pattern. In step 1714, the second pattern is allowed to transfer into the radiation sensitive layer from the resettable or reversible contrast enhancing layer.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

The term "lens," where the context allows, can refer to any one or combination of various types of optical components, including refractive, reflective, magnetic, electromagnetic, electrostatic, or the like optical components.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method, comprising:
   (a) forming a radiation sensitive layer on a substrate;
   (b) forming a resettable or reversible contrast enhancing layer on the radiation sensitive layer;
   (c) bleaching the contrast enhancing layer with a first pattern directed through a first channel of an optical system;
   (d) resetting or reversing the contrast enhancing layer to unbleach the contrast enhancing layer; and
   (e) bleaching the contrast enhancing layer with a second pattern directed through a second channel of the optical system.

2. The method of claim 1, wherein (c) and (e) are performed substantially simultaneously.

3. The method of claim 1, wherein (d) comprises:
   using an unbleaching beam having a predetermined wavelength to perform the unbleaching of the contrast enhancing layer.

4. The method of claim 3, wherein the unbleaching beam is directed through a third channel of the optical system.

5. The method of claim 3, wherein the unbleaching beam is transmitted to a target area on the substrate at a point in time between respective times of exposure by the first and second patterns of the target area.

6. The method of claim 1, wherein (d) comprises using a material for the contrast enhancing layer that unbleaches after a predetermined time period.

7. The method of claim 6, wherein the first pattern fades from the contrast enhancing layer after the predetermined time period.

8. The method of claim 1, further comprising using a laser dye as a material making up the resettable or reversible contrast enhancing layer.

9. The method of claim 1, wherein the first pattern is formed in different positions on the substrate with respect to the second pattern.

10. Forming a flat panel display using the method of claim 1.

11. Forming an integrated circuit using the method of claim 1.

12. The method of claim 1, further comprising:
    performing (c) and (e) using a maskless lithography system.

13. The method of claim 1, further comprising:
    performing (c) and (e) using a mask-based lithography system.

14. A method of using a resettable contrast enhancing layer, comprising:
    bleaching the resettable contrast enhancing layer using light directed through a first channel of an optical system, wherein the light directed through the first channel is patterned;
    unbleaching the resettable contrast enhancing layer using light directed through a second channel of the optical system, wherein the light directed through the second channel is not patterned; and
    bleaching the resettable contrast enhancing layer using light directed through a third channel of the optical system, wherein the light directed through the third channel is patterned.

15. The method of claim 14, further comprising forming the resettable contrast enhancing layer using a laser dye.

* * * * *